United States Patent
Lin et al.

(10) Patent No.: US 6,399,997 B1
(45) Date of Patent: Jun. 4, 2002

(54) HIGH PERFORMANCE SYSTEM-ON-CHIP USING POST PASSIVATION PROCESS AND GLASS SUBSTRATES

(75) Inventors: Mou-Shiung Lin, Hsinchu; Jin-Yuan Lee, Hsin-chu, both of (TW)

(73) Assignee: Megic Corporation, Hsin-chu (TW)

( * ) Notice: Subject to any disclaimer, the term of this patent is extended or adjusted under 35 U.S.C. 154(b) by 0 days.

(21) Appl. No.: 09/631,041

(22) Filed: Aug. 1, 2000

(51) Int. Cl.$^7$ .............................................. H01L 21/20
(52) U.S. Cl. ....................... 257/531; 438/238; 438/381; 438/455; 438/459; 257/783
(58) Field of Search .......................... 257/277, 782–783, 257/438, 528–540; 438/238–239, 381–382, 455–459

(56) References Cited

U.S. PATENT DOCUMENTS 6,268,225 B1 * 7/2001 Chen et al. .................... 438/15
6,287,931 B1 * 9/2001 Chen .......................... 438/381

* cited by examiner

Primary Examiner—Jey Tsai
(74) Attorney, Agent, or Firm—George O. Saile; Stephen B. Ackerman

(57) ABSTRACT

A new method is provided to create semiconductor devices. A completed semiconductor device that may or may contain passive electrical components is attached to a glass panel by means of an adhesive layer. The surface of the raw silicon layer of the substrate is now removed in addition to the silicon that is present between adjacent circuits. The objective of the process of the invention is to remove as much of the raw, loss inducing silicon as possible thus eliminating losses that are induced by the silicon substrate and as a consequence improving the quality of the passive components that overly the active surface of the substrate. By removing silicon from between adjacent circuits, interference between adjacent circuits is also eliminated.

40 Claims, 4 Drawing Sheets

HIGH PERFORMANCE SYSTEM-ON-CHIP USING POST PASSIVATION PROCESS AND GLASS SUBSTRATES

This application is related to Ser. No. 09/251,183, filed on Feb. 17, 1999.

BACKGROUND OF THE INVENTION (1) Field of the Invention

The invention relates to the fabrication of integrated circuit devices, and more particularly, to a method of reducing substrate effects that are typically incurred by discrete passive components that are created overlying the surface of a silicon substrate.

(2) Description of the Prior Art

The creation of semiconductor devices typically starts with a monocrystalline silicon substrate, a surface region of the substrate into which the semiconductor devices are to be created is subjected to a n-type or p-type impurity implant forming n-wells or p-wells in the surface of the substrate. The n-wells or p-wells form the conductivity basis over which additional processes and implants are performed to create active functional semiconductor devices in or on the surface of the underlying silicon substrate.

Most of the processes that are performed for the creation of a semiconductor device are "best can do" sequences and conditions that have over the years been refined and that provide close to the ideal required results. From this cannot be concluded that no more challenges remain in the creation of semiconductor devices or in ongoing attempts to improve the performance of these devices. Even "best can do" processes leave in place conditions that restrict the reaching of the ideal conditions of device performance or implementation, major efforts of investigation will therefore continue to be aimed at eliminating these restrictions. As an example of a restriction that is imposed on device performance can be cited the creation of inductive components overlying the surface of a semiconductor surface. An energized inductor will be surrounded by electromagnetic fields, where the inductor is created on the surface of a substrate these electromagnetic fields will penetrate the surface of the substrate, thereby incurring inductive losses that reduce the performance of the inductor. Efforts to improve the performance of the inductor must therefore be aimed at reducing the electromagnetic losses incurred by the electromagnetic fields of the inductor in the surface of the silicon substrate.

The semiconductor technology continues to emphasize device performance improvements that can be achieved at competitive prices. Device performance improvements can best be accomplished by device miniaturization, which, over the years, has been made possible by continued advances of semiconductor processes and materials in combination with new and increasingly sophisticated device designs. Most semiconductor devices are aimed at processing digital data. There are however also numerous semiconductor device designs and approaches that are aimed at incorporating analog functions into devices that simultaneously process digital and analog data, or devices that can be used for the processing of analog data only. One of the major challenges encountered in the creation of analog signal processing circuitry (using digital processing procedures and equipment) is that a number of the components that are used for analog circuitry are large in size and can therefore not readily be integrated into devices that typically have feature sizes that approach the sub-micron range. The main components that offer a challenge in this respect are capacitors and inductors since both these components are, for typical analog processing circuits, of considerable size.

As an example of the benefits that can be derived can be cited the creation of an inductor. The emphasis is on the creation of an inductor of high Q value on the surface of a semiconductor substrate, using methods and procedures that are well known in the art for the creation of semiconductor devices.

A typical application for an inductor is in the field of modern mobile communication applications that make use of compact high-frequency equipment. Continued improvements in the performance characteristics of this equipment has over the years been achieved, further improvements will place continued emphasis on lowering the power consumption of the equipment, on reducing the size of the equipment, on increasing the frequency of the applications and on creating low noise levels. One of the main applications of semiconductor devices in the field of mobile communication is the creation of Radio Frequency (RF) amplifiers. RF amplifiers contain a number of standard components whereby however a major component of a typical RF amplifier is a tuned circuit that contains inductive and capacitive components. Tuned circuits form, dependent on and determined by the values of their inductive and capacitive components, an impedance that is frequency dependent, enabling the tuned circuit to either present a high or a low impedance for signals of a certain frequency. The tuned circuit can therefore either reject or pass and further amplify components of an analog signal based on the frequency of that component. The tuned circuit can in this manner be used as a filter to filter out or remove signals of certain frequencies or to remove noise from a circuit configuration that is aimed at processing analog signals. The tuned circuit can also be used to form a high electrical impedance by using the LC resonance of the circuit and to thereby counteract the effect of parasitic capacitances that are part of a circuit. One of the problems that is encountered when creating an inductor on the surface of a semiconductor substrate is that the self-resonance that is caused by the parasitic capacitance between the (spiral) inductor and the underlying substrate will limit the use of the inductor at high frequencies. As part of the design of such an inductor it is therefore of importance to reduce the capacitive coupling between the created inductor and the underlying substrate, in addition the creation of a high Q value inductor requires minimizing the electromagnetic losses incurred by the inductor.

Extensive research has been dedicated in the industry to the incorporation of RF inductors in semiconductor devices without sacrificing device performance due to substrate losses. Some of the techniques that have been used for this approach include:

the selective removing (by etching) of the silicon underneath the inductor (using methods of micro-machining) thereby removing substrate parasitic effects using multiple layers of metal (such as aluminum) interconnects or of copper damascene interconnects using a high resistivity silicon substrate thereby reducing resistive losses in the silicon substrate, since resistive substrate losses form a dominant factor in determining the Q value of silicon inductors using metals that are particularly adaptable to the process of the formation of inductors; a concern is thereby however raised by the use of AlCu (a metal that is frequently used in semiconductor metallization) since AlCu has higher resistivity than gold (Au) metallization that is frequently used in GaAs technology employing biased wells underneath a spiral conductor inserting various types of patterned ground shields between the spiral inductor and the silicon substrate, and creating an active inductive component that simulates the electrical properties of an inductor as it is applied in active circuitry; this approach however results in high power consumption by the inductor and in noise performance that is unacceptable for low power, high frequency applications.

The above approaches have as common objectives to:

1) enhance the quality (Q) value of the inductor
2) increase the frequency of the LC self-resonance thereby increasing the frequency range over which the inductor can be used, and
3) reduce the surface area that is required for the creation of the inductor.

Where the above has highlighted the use and implementation of an inductor in a semiconductor device, similar considerations apply to components such as a capacitor and a resistor that form part of a semiconductor device.

SUMMARY OF THE INVENTION

A principle objective of the invention is to reduce electromagnetic losses that are typically incurred by electrical components that are created on or above the surface of a silicon substrate.

Another objective of the invention is to reduce electrical interference from occurring between adjacent semiconductor devices.

Yet another objective of the invention is to reduce all detrimental influences such as eddy currents, parasitic capacitances and the like, that typically occur in a silicon surface and that negatively affect the performance of the components that are created overlying the surface of a silicon substrate.

In accordance with the objectives of the invention a new method is provided to create semiconductor devices. An unprocessed silicon substrate initially contains a first surface of raw, untreated silicon in which, in or on the surface of the substrate, semiconductor devices are created. Input/output (I/O) pads are created on the first surface of the substrate, layers of interconnect lines that connect to the I/O pads are created over the first surface of the substrate. The semiconductor devices are then protected from external influences by a layer of passivation that is deposited over the created layer of interconnect lines, I/O pads are created through the layer of passivation to the top surface of the layers of interconnect lines for further I/O connect. Passive components can be created on the surface of the layer of passivation, these passive components can be thin film passive components. The process of the invention applies an adhesive layer over the passive components and uses this layer of adhesive material to attach the completed semiconductor substrate to a glass surface. The second surface of the raw unprocessed silicon layer of the substrate underlying the passive components is now removed in addition to the silicon of the second surface of the substrate that is present between adjacent circuits. The objective of the process of the invention is to remove a maximum amount of the raw, unprocessed and loss inducing silicon, eliminating losses that are induced by the silicon substrate and as a consequence improve the quality of the passive components that overly the active surface of the substrate. By removing silicon from between adjacent circuits, interference between adjacent circuits is also eliminated.

DESCRIPTION OF THE PREFERRED EMBODIMENTS

As has previously been pointed out, typical semiconductor device processes use as one of the last steps that leads to the creation of a semiconductor device the deposition of a layer of passivation, this to protect the created device from external damage and influence (corrosion, surface scratching and the like). By on the other hand creating the device components on the surface of a thick layer of dielectric, such as polyimide, that has been deposited over the passivation layer (post-passivation processing), electromagnetic losses can be reduced significantly. These losses can be reduced even further by removing the silicon in which these losses incur. The process of the invention provides methods by which this removal of silicon (underlying the created circuit in the surface of the substrate and the components overlying the surface of the substrate) can be removed.

Figure 1:
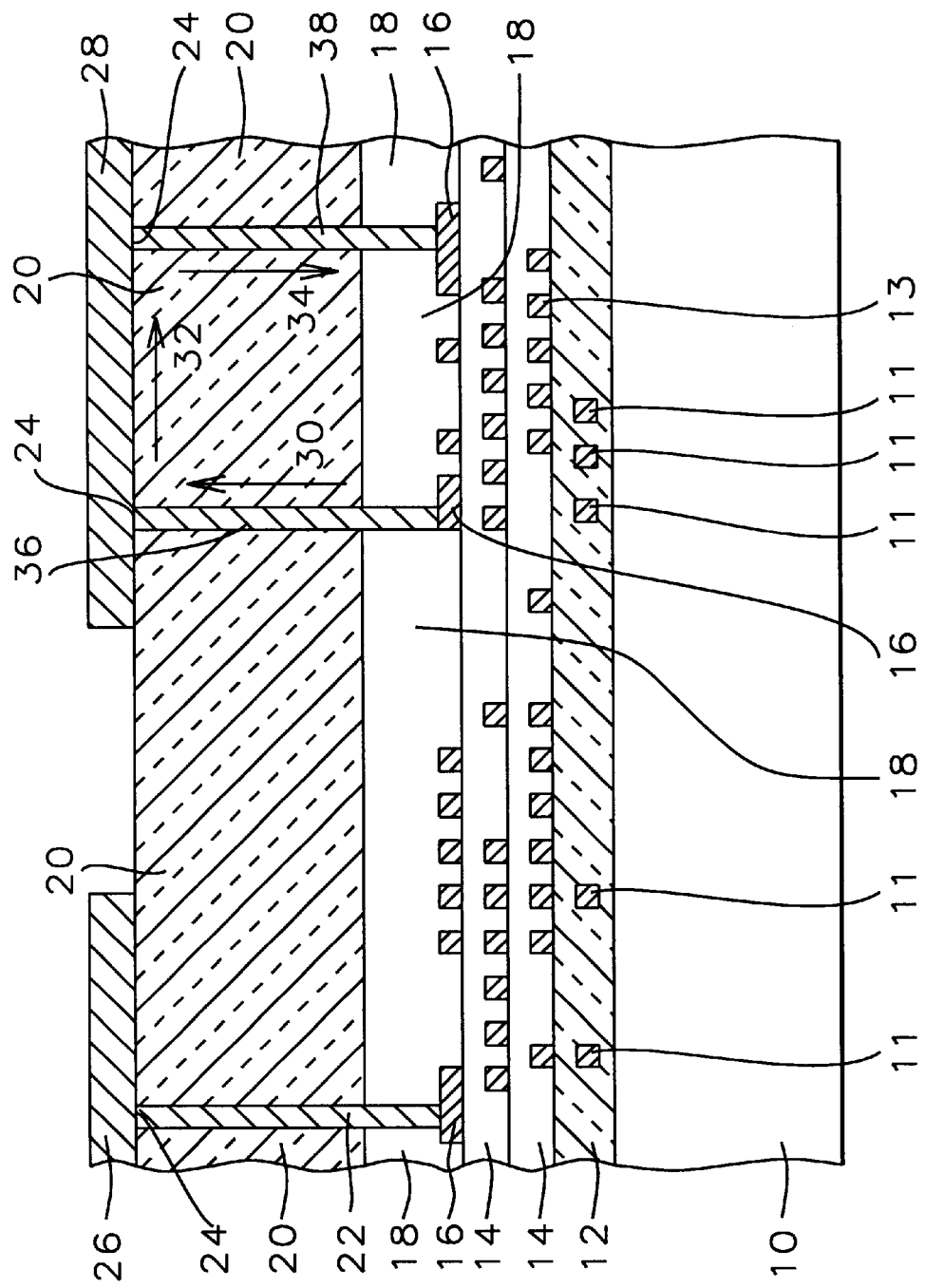
FIG. 1 shows a cross section of an interconnection scheme having an upper wide-layer line scheme and lower fine-line metallization.

Referring now more specifically to FIG. 1, there is shown a cross section of one implementation of the related application Ser. No. 09/251,183, filed on Feb. 17, 1999, and herein incorporated by reference.

The surface of silicon substrate 10 has been provided with transistors and other devices (not shown in FIG. 1). The surface of substrate 10 is covered with a dielectric layer 12, layer 12 of dielectric is therefore deposited over the devices that have been provided in or on the surface of substrate 10. Conductive interconnect lines 11 are provided inside layer 12 that connect to the semiconductor devices that have been provided in or on the surface of substrate 10.

Layers 14 (two examples are shown) represent all of the metal layers and dielectric layers that are typically created on top of the dielectric layer 12, layers 14 that are shown in FIG. 1 may contain multiple layers of dielectric or insulation and the like, conductive interconnect lines 13 make up the network of electrical connections that are created throughout layers 14. Overlying and on the surface of layers 14 are points 16 of electrical contact. These points 16 of electrical contact can for instance be bond pads that establish electrical interconnects to the transistors and other devices that have been provided in the surface of the substrate 10. These points of contact 16 are points of interconnect in the Integrated Circuit (IC) that need to be further connected to surrounding circuitry. A passivation layer 18, formed of for example silicon nitride, is deposited over the surface of layer 14 to protect underlying layers from moisture, contamination, etc.

The key steps of the above referenced application begin with the deposition of a thick layer 20 of polymer that is deposited over the surface of layer 18. Access must be provided to points of electrical contact 16, for this reason a pattern of openings 22 is etched through the polymer layer 20 and the passivation layer 18, the pattern of openings 22 aligns with the pattern of electrical contact points 16. Contact points 16 are, by means of the openings 22 that are created in the layer 20 of polymer, electrically extended to the surface of layer 20.

The above referenced material that is used for the deposition of layer 20 is preferably polyimide, though the material that can be used for this layer is not limited to polyimide but can contain any of the known polymers ($SiCl_xO_y$). The indicated polyimide is the preferred material to be used for the processes of the invention for the thick layer 20 of polymer. Examples of polymers that can be used are silicons, carbons, fluoride, chlorides, oxygens, parylene or teflon, polycarbonate (PC), polysterene (PS), polyoxide (PO), poly polooxide (PPO) and benzocyclobutene (BCB).

Electrical contact with the contact points 16 can now be established by filling the openings 22 with a conductive material. The top surfaces 24 of the metal conductors that are contained in openings 22 can now be used for connection of the IC to its environment, and for further integration of the IC into surrounding electrical circuitry. This latter statement is the same as saying the semiconductor devices that have been provided in the surface of substrate 10 can, via the conductive interconnects contained in openings 22, 36 and 38 be further connected to surrounding components and circuitry. Interconnect pads 26 and 28 formed on top of surfaces 24 of the metal interconnects contained in openings 22, 36 and 38. These pads 26 and 28 can be of any design in width and thickness to accommodate specific circuit design requirements. A larger size pad can, for instance, be used as a flip chip pad. A somewhat smaller pad can be used for power distribution or as a ground or signal bus. The following connections can, for instance, be made to the pads shown in FIG. 1: pad 26 can serve as a flip chip pad, pad 28 can serve as a flip chip pad or can be connected to electrical power or to electrical ground or to an electrical signal bus. There is no connection between the size of the pads shown in FIG. 1 and the suggested possible electrical connections for which this pad can be used. Pad size and the standard rules and restrictions of electrical circuit design determine the electrical connections to which a given pad lends itself.

The following comments relate to the size and the number of the contact points 16, FIG. 1. Because these contact points 16 are located on top of a relatively thin dielectric (layer 14, FIG. 1) the pad size cannot be too large since a large pad size brings with it a large capacitance. In addition, a large pad size will interfere with the routing capability of that layer of metal. It is therefore preferred to keep the size of the pad 16 relatively small. The size of pad 16 is however also directly related with the aspect ratio of vias 22/36/38. An aspect ratio of about 5 is acceptable for the consideration of via etching and via filling. Based on these considerations, the size of the contact pad 16 can be in the order of 0.5 um to 3 um, the exact size being dependent on the thickness of layers 18 and 20.

The referenced application does not impose a limitation on the number of contact pads that can be included in the design, this number is dependent on package design requirements. Layer 18 in FIG. 1 can be a typical IC passivation layer.

The most frequently used passivation layer in the present state of the art is plasma enhanced CVD (PECVD) oxide and nitride. In creating layer 18 of passivation, a layer of approximately 0.2 um. PECVD oxide can be deposited first followed by a layer of approximately 0.7 um. nitride. Passivation layer 18 is very important because it protects the device wafer from moisture and foreign ion contamination. The positioning of this layer between the sub-micron process (of the integrated circuit) and the tens-micron process (of the interconnecting metalization structure) is of critical importance since it allows for a cheaper process that possibly has less stringent clean room requirements for the process of creating the interconnecting metalization structure.

Layer 20 is a thick polymer dielectric layer (for example polyimide) that has a thickness in excess of 2 um (after curing). The range of the polymer thickness can vary from 2 um. to 30 um, dependent on electrical design requirements.

For the deposition of layer 20 the Hitachi-Dupont polyimide HD 2732 or 2734 can, for example, be used. The polyimide can be spin-on coated and cured. After spin-on coating, the polyimide will be cured at 400 degrees C. for 1 hour in a vacuum or nitrogen ambient. For thicker polyimide, the polyimide film can be multiple coated and cured.

Another material that can be used to create layer 20 is the polymer benzocyclobutene (BCB). This polymer is at this time commercially produced by for instance Dow Chemical and has recently gained acceptance to be used instead of typical polyimide application.

The dimensions of openings 22, 36 and 38 have previously been discussed. The dimension of the opening together with the dielectric thickness determine the aspect ratio of the opening. The aspect ratio challenges the via etch process and the metal filling capability. This leads to a diameter for openings 22, 36 and 38 in the range of approximately 0.5 um. to 3.0 um., the height for openings 22/36/38 can be in the range of approximately 3 um. to 20 um. The aspect ratio of openings 22/36/38 is designed such that filling of the via with metal can be accomplished. The via can be filled with CVD metal such as CVD tungsten or CVD copper, with electro-less nickel, with a damascene metal filling process, with electroplating copper, etc.

The referenced application can be further extended by applying multiple layers of polymer (such as polyimide) and can therefore be adapted to a larger variety of applications. The function of the structure that has been described in FIG. 1 can be further extended by depositing a second layer of polyimide on top of the previously deposited layer 20 and overlaying the pads 26 and 28. Selective etching and metal deposition can further create additional contact points on the surface of the second layer of polyimide that can be interconnected with pads 26 and 28. Additional layers of polyimide and the thereon created contact pads can be customized to a particular application, the indicated extension of multiple layers of polyimides greatly enhances the flexibility and usefulness of the referenced continuation-in-part application.

FIG. 1 shows a basic design advantage of the related application. This advantage allows for the sub-micron or fine-lines, that run in the immediate vicinity of the metal layers 14 and the contact points 16, to be extended in an upward direction 30 through metal interconnect 36, this extension continues in the direction 32 in the horizontal plane of the metal interconnect 28 and comes back down in the downward direction 34 through metal interconnect 38. The functions and constructs of the passivation layer 18 and the insulating layer 20 remain as previously highlighted. This basic design advantage of the invention is to "elevate" or "fan-out" the fine-line interconnects removing these interconnects from the micro and sub-micro level to a metal interconnect level that has considerably larger dimensions (layer width and thickness) and that therefore has smaller resistance and capacitance and is easier and more cost effective to manufacture. This aspect of the referenced application does not include any aspect of conducting line re-distribution and therefore has an inherent quality of simplicity. It therefore further adds to the importance of the referenced application in that it makes micro and sub-micro wiring accessible at a wide and thick metal level. The interconnections 36 and 38 interconnect the fine-level metal by going up through the passivation and polymer or polyimide dielectric layers, transverse over a distance on the wide and thick metal level and continue by descending from the wide and thick metal level back down to the fine-metal level by again passing down through the passivation and polymer or polyimide dielectric layers. The extensions that are in this manner accomplished need not to be limited to extending fine-metal interconnect points 16 of any particular type, such as signal or power or ground, with wide and thick metal line 28. The laws of physics and electronics will impose limitations, if any, as to what type of interconnect can by established in this manner where limiting factors will be the conventional limiting factors of resistance, propagation delay, RC constants and others. Where the related application is of importance is that the related application provides much broader Latitude in being able to apply these laws and, in so doing, provides a considerably extended scope of the application and use of Integrated Circuits and the adaptation of these circuits to a wide and thick metal environment.

Figure 2:
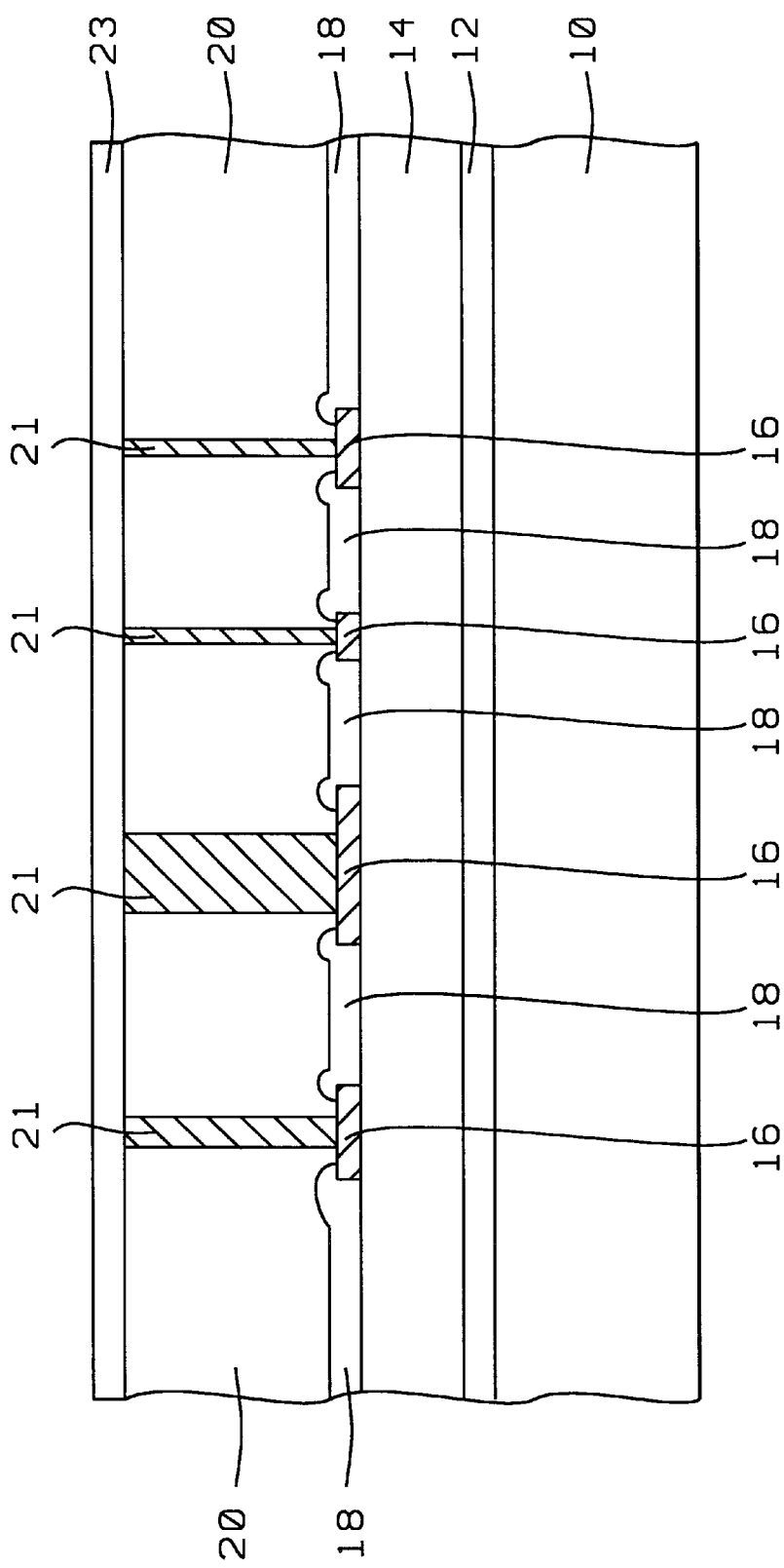
FIG. 2 shows a cross section of a simplified version of the substrate and the layers that are created on the surface of the substrate in FIG. 1.

FIG. 2 shows, for reasons of clarity, a simplified cross section of the substrate and the layers that are created on the surface of the substrate under the related invention, the highlighted areas that are shown have previously been identified as:
- 10 the silicon substrate
- 12 is a layer of dielectric that has been deposited over the surface of the substrate
- 14 is an interconnect layer that contains interconnect lines, vias and contact points
- 16 are the contact points on the surface of the interconnect layer 14
- 18 is a layer of passivation into which openings have been created through which the contact points 16 can be accessed
- 20 is a thick layer of polyimide
- 21 are the conductive plugs that have been provided through the layer 20 of polyimide,
- 23 is a layer of passive or discrete components that are created overlaying the thick layer 20 of polyimide.

The thick layer 20 of polyimide can be coated in liquid form on the surface of the layer 18 of passivation or can be laminated over the surface of layer 18 of passivation by dry film application. Vias that are required for the creation of conductive plugs 21 can be defined by conventional processes of photolithography or can be created using laser (drill) technology.

Electrical components such as an inductor, a capacitor and the like can be created on the surface of layer 20 of polyimide and in electrical contact with conductive plugs 21. The inductor, capacitor and the like can be build-in using a build-up thin film process or can be surface mounted discrete passive components. The passive components are represented by layer 23, FIG. 2. Layer 12 of dielectric may, in the cross section that is shown in FIG. 2, be part of layer 14 since layer 14 is a layer of Intra Level Dielectric (ILD) within which layer 12 can be readily integrated.

Figure 3:
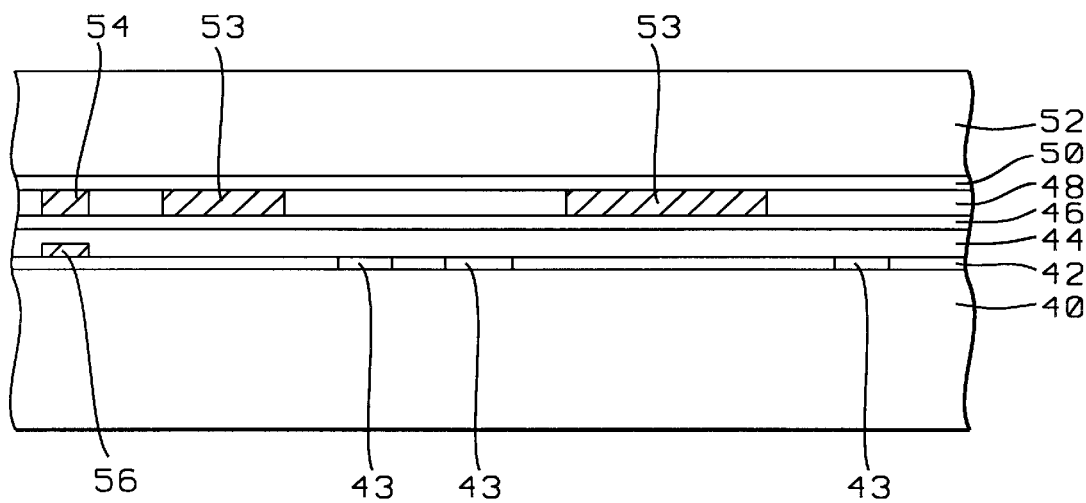
FIG. 3 shows a cross section of a silicon substrate with active semiconductor devices formed in or on the surface of the substrate, a layer of interconnect lines has been created on the surface of the substrate, a layer of passivation have been deposited over the interconnect lines, passive discrete components have been formed over the layer of passivation, a glass plate has been attached to the surface of the passive discrete components.

Referring now specifically to FIG. 3, there is shown a cross section of a silicon substrate 40 on the surface of which have been formed additional layers and passive components. The silicon substrate 40, including the additional layers and components that have been created on the active surface of the substrate, has been attached to a glass plate. The additional layers that have been created over the active surface of substrate 40 are:
- 42 is a layer of active semiconductor devices in or on the surface of silicon substrate 40, contained in layer 40 are a number of
- 43 semiconductor devices,
- 44 is a layer of dielectric wherein conductive interconnect lines, vias and contact points are created, these conductive interconnect lines, vias and contact points make contact with semiconductor devices 43
- 46 is a layer of passivation that has been deposited over the surface of layer 44
- 48 is a layer of discrete or integrated passive components such as inductors, capacitors, resistors that have been created overlying the layer 46 of passivation
- 56 is a sample I/O contact pad that makes contact with a semiconductor circuit in layer 42 (not shown in FIG. 3) and that provides for making a first contact (from the bottom of the interconnect layer 44) with the semiconductor circuits contained in layer 42
- 54 is a sample I/O contact pad that makes contact with a semiconductor circuit (not shown in FIG. 3) and that provides for making a second contact (from the top of the interconnect layer 44) with the semiconductor circuits contained in layer 42
- 53 are additional contact pads and are functionally similar to contact pad 54
- 50 is a layer of adhesive material that is deposited over the surface of layer 48 and that serves to form a bond between layer 48 and a glass plate
- 52, thereby attaching the substrate 40 with its overlying layers 42, 44, 46 and 48 to the glass plate 52.

In the above highlighted structures, it must be understood that pad 54 will be elevated to the upper level during the process of creating the passivation, polyimide, passive components layers.

Not shown in FIG. 3 but equally possible to apply as part of the invention, is a thick layer of polymer deposited over the surface of the layer of passivation 46 over which, as in the referenced application, a network of thick, wide metal can be created. The invention is also not dependent on the presence of the layer 44 of conductive interconnect lines.

The surface of silicon substrate in which the active devices 43 have been created is referred to as the top or active surface of substrate 40, the opposing surface of substrate 40 in which raw, unprocessed (no semiconductor device created therein) silicon is present is referred to as the bottom or passive surface of substrate 40.

Layer 42 may contain semiconductor devices 43 that are of any known type or design, the process of the invention does not depend on this. It is assumed that points of electrical contact are provided in the surface of silicon substrate 40 that make electrical contact with the semiconductor devices that have been created in layer 42 in or on the surface of substrate 40.

Semiconductor devices that have been created in layer 42 are further connected to surrounding circuitry and components (not shown in FIG. 3) by means of an interconnect layer 44 that may contain conductive interconnect lines, contact points and vias. The structure of layer 44 is also not germane to the process of the invention, layer 44 may contain multiple layers of dielectric, interconnect lines, layers of insulation, and the like. Access to the top and bottom surfaces of layer 44 is provided by means of contact pads. Contact pad 56 is a representative sample of a contact pad that has been provided in the bottom surface of the interconnect layer 44 (the surface of layer 44 that is closest to the surface of the substrate 40) while contact pad 54 is a representative sample of a contact pad that has been provided in the top surface of the interconnect layer 44 (the surface of layer 44 that is furthest removed from the surface of the substrate 40).

Layer 46 is a typical layer of passivation that is deposited over the surface of the interconnect interface layer 44. Materials and processes that can be used for the creation of layer 46 have previously been indicated under FIG. 1 above and will therefore not be repeated at this time.

Layer 48 that is created on the surface of the passivation layer 46 may contain any number and type of passive or discrete components that are typically created on the surface of a semiconductor substrate such as resistors, inductors and capacitors.

The substrate 40 with the overlying layers 42, 44, 46 and 48 complete a typical arrangement of semiconductor devices. For such an arrangement of semiconductor devices, a layer 50 of adhesive material is, under the process of the invention, deposited over the surface of layer 48. Layer 50 serves to glue or attach the semiconductor device arrangement to the glass plate 52.

Figure 4:
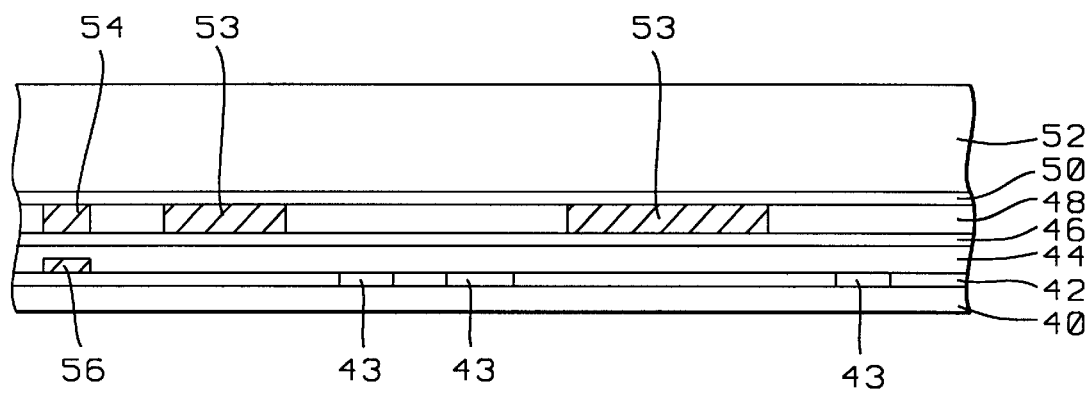
FIG. 4 shows a cross section of the silicon substrate of FIG. 3, the thickness of the silicon substrate has been reduced by removing silicon from the bottom or passive side of the substrate, leaving a thin body of silicon in place.

FIG. 4 shows a cross section of the invention in which the silicon substrate 40 of FIG. 3 whereby the thickness of the silicon substrate 40 has been reduced by removing silicon from the bottom or passive side of the substrate 40 leaving a thin body 40 of silicon in place. It must be noted from FIG. 4 that, other than the thickness of the substrate 40, the cross section of FIG. 4 is identical with the cross section that is shown in FIG. 3. The thickness of substrate 40 as shown in FIG. 4 can be reduced to about 20 um, conventional process of CMP or backside grinding as is known in the art can be used for this reduction on thickness of substrate 40.

Figure 5:
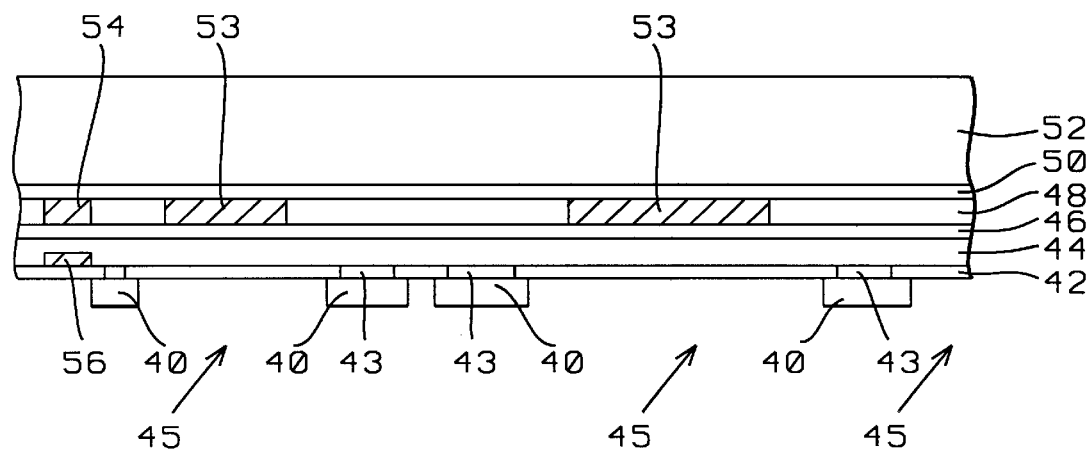
FIG. 5 shows a cross section of the silicon substrate of FIG. 4, the thin body of silicon has been selectively etched.
Figure 6:
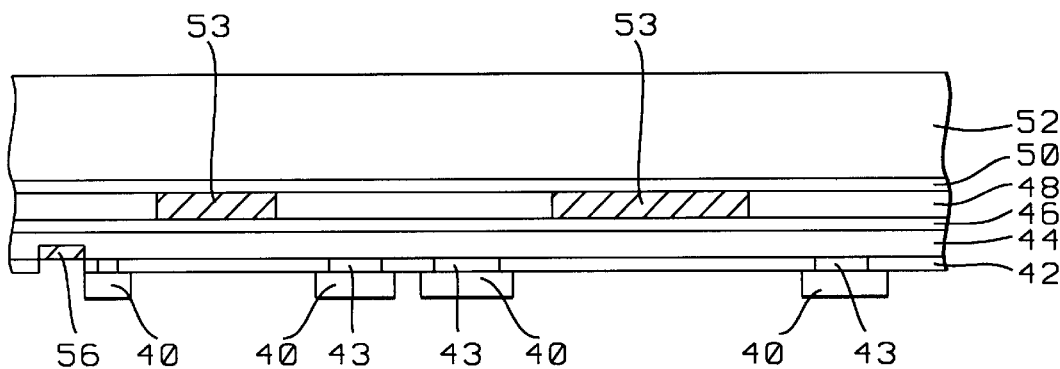
FIG. 6 shows a cross section of the silicon substrate of FIG. 5, an I/O pad has been opened to the interconnect layer close to the surface of the thin body of silicon.

FIG. 5 shows a cross section of the silicon substrate of FIG. 4 whereby the thin body 40 of silicon (FIG. 4) has been selectively etched, regions 45. The cross sections 40 that are shown in FIG. 5 are remnants of silicon of the original silicon substrate 40 that contain the semiconductor devices that have originally been created in or on the active surface of substrate 40. As semiconductor device must in this respect be understood any device configuration in or on the surface of substrate 40 that cannot be physically interrupted (etched or any of its content materials being removed by any other means) without disturbing the functionality of the device. It is apparent from the cross section that is shown in FIG. 6 that a significant amount of silicon has been removed (areas 45) from the already thinned down silicon layer 40 of FIG. 4. This is the objective of the process of the invention since any silicon that can interfere with the quality or functioning of any of the passive components that have been created on the surface of substrate 40 (contained in layer 48) has a negative effect on the electrical performance of the discrete passive components.

The process of etching the silicon substrate to create regions 45 (FIG. 5) is performed mainly by wet etching or plasma etching. In wet etching, the typical solution that can be used is KOH (potassium hydroxide). In plasma etching as used in the manufacturing of silicon integrated devices, a silicon wafer is positioned on a first electrode in a chamber that also includes a second electrode spaced opposite the first. As a gaseous medium that consists of one or more gasses is flowed through the chamber, an r-f voltage, which may include components at different frequencies, is applied between the two electrodes to create a discharge that ionizes the gaseous medium and that forms a plasma that etches the wafer. By appropriate choice of the gasses of the gaseous medium and the parameters of the discharge, selective and anisotropic etching is achieved. In most modern processes, a dry etch is performed wherein the wafer is exposed to a plasma, formed in the flow of one or more gasses. Typically, one or more halogenated compounds are used as an etchant gas. For example, $CF_4$, $CHF_3$ (freon 23) $SF_6$, $NF_3$, can be used. Added can be gases such as $O_2$, Ar, and $N_2$.

FIG. 6 shows a cross section of the silicon substrate of FIG. 5 whereby I/O pad 56 has been made available for I/O interconnect in the side of layer 44 (the interconnect layer) that is closest to the surface of the thin body 40 of silicon. For reasons of clarity, only one point 56 of I/O to the interconnect layer 44 has been shown. It is clear that this I/O pad is further connected to integrated circuits 40 by means of interconnect lines that are contained within the interconnect layer 44. I/O pad 56 is therefore potentially any I/O point of contact to any of the semiconductor devices that have originally been created in or on the surface of substrate 40. The creation of the opening to I/O pad 56 requires the removal of silicon oxide or a so-called Inter Layer Dielectric (ILD) that is overlying the I/O pad 56 and can be performed using wet or plasma etching.

Figure 7:
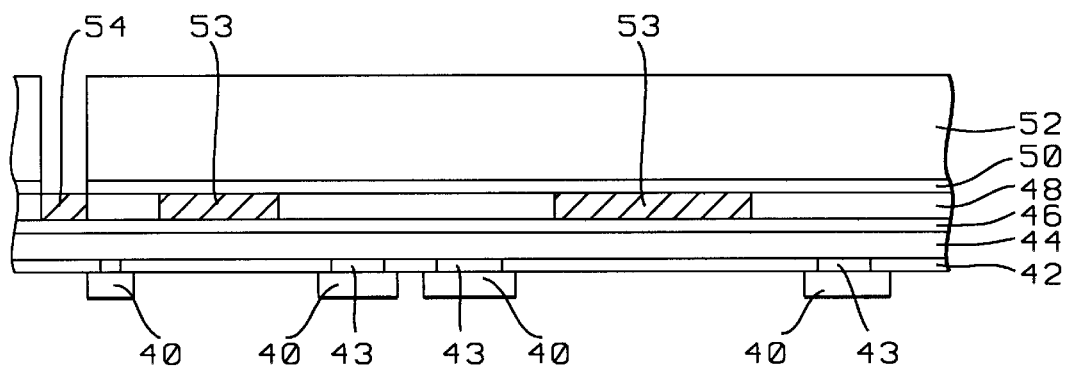
FIG. 7 shows a cross section of the silicon substrate of FIG. 5, an I/O pad has been opened to the interconnect layer on the glass substrate side.

FIG. 7 shows a cross section of the silicon substrate of FIG. 5 whereby an I/O pad 54 has been opened to the top surface of the interconnect layer 44 for access to I/O contact pad 54. FIGS. 6 and 7 are shown as examples of how the interconnect layer 44 can be accessed from both sides or both surfaces of the interconnect layer 44, that is the surface that is closest to the original silicon substrate 40 and the surface that is furthest removed from the silicon substrate 40.

The creation of the opening through which I/O pad 54 can be accessed requires the etching through a layer 52 of glass, through a layer 50 of adhesive. I/O pad 54 is already elevated to the upper level during the process of creating layers 46 and 48.

The layer 52 of glass can be etched a wet etch or plasma etch. The wet etch is conducted using HF solution. In plasma etching, an anisotropic etch is performed using a fluorine containing gas such as $CHF_3$ or $CF_4$. As part of this etch, an opening can be created in the layer 50 of adhesive.

The most commonly used and therefore the preferred dielectrics for layer 48 are silicon dioxide (doped or undoped), silicon oxynitride, parylene or polyimide, spin-on-glass, plasma oxide or LPCVD oxide.

For layer 46 of passivation can be used for instance silicon nitride due to its ability to provide an impermeable barrier to moisture and mobile impurities. Silicon nitride also forms a tough coating that protects an underlying integrated circuit against mechanical damage.

Various materials have found application in the creation of passivation layers. Passivation layer can contain silicon oxide/silicon nitride (SiO$_2$/Si$_3$N$_4$) deposited by CVD, passivation layer can be a photosensitive polyimide or can comprise titanium nitride. Another material often used for passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure such as the ability to fill openings of high aspect ratio, a relatively low dielectric constant (about 3.2), a simple process required for the depositing of a layer of polyimide, the reduction of sharp features or steps in the underlying layer, high temperature tolerance of cured polyimide. Photosensitive polyimides have these same characteristics but can, in addition, be patterned like a photoresist mask and can, after patterning and etching, remain on the surface on which it has been deposited to serve as a passivation layer. The process of depositing and patterning polyimide is relatively simple and is well understood in the art. Polyimide is typically spun on in the form of a liquid (polyamic-acid precursor). After spin-on, the polyimide may be cured whereby the spun-on polyimide becomes a solid polyimide film. Etching of the cured film often uses oxygen or fluorine based plasma. Polyimide is typically applied over the entire substrate followed by a baking step to cure and evaporate the solvents in the polyimide. Curing of the polyimide provides extra protection to the device circuitry. This step is typically a high temperature cure, at 350 to 400 degrees C., in a N$_2$ gas ambient for a time period between about 1.5 and 2.5 hours.

Polyimide provides extra protection to the surface of the silicon chip against scratching, cracking and other types of mechanical damage. Most often, mechanical damage occurs during assembly, packaging or any subsequent handling of the die. As a passivation layer, polyimide also guards against thin film oracking which frequently results from the packaging of very large dies into plastic packages.

The invention has provides the following advantages:

a maximum amount of silicon can be removed from the silicon substrate that has been used to create Integrated Circuits and passive components, resulting in optimum performance of the passive components that have been created on the surface of the substrate, and the method of the invention provides for easy access to both surfaces of the interconnect layer, the latter layer containing conductive interconnect lines, contact points and vias, thereby not creating additional manufacturing concerns of I/O accessibility and making the process of the invention readily integratable into a modern semiconductor manufacturing facility.

The invention can be summarized as follows:

one or more layers of conductive interconnect are created on the surface of a substrate, these layers of interconnect are electrically accessible at an upper and a lower surface a layer of passivation is deposited over the surface of the layers of interconnects discrete components can be mounted on the surface of the passivation layer the surface of the discrete components is coated with a layer of adhesive material the completed semiconductor substrate is attached to a glass panel by pressing the substrate with the adhesive layer against a glass panel, and unprocessed silicon is removed starting from the passive surface of the substrate (by processes of Chemical Mechanical Polishing (CMP)) while unprocessed silicon is also removed (by methods of etching, applied to the passive side of the silicon substrate) from in between adjacent completed semiconductor devices that have been created in or on the active surface of the substrate.

The invention further lends itself to the deposition of the thick layer of polymer over the layer of passivation prior to the mounting or creation of discrete passive components. The process of the invention also does not depend on the presence of interconnect layers on the surface of the substrate.

The invention therefore uses the following layers, approaching the process from the surface of the silicon substrate:

a layer of interconnect networks may or may not be part of the invention a layer of passivation is always part of the invention a thick insulating, passivating layer may or may not be part of the invention a layer of passive components is always part of the invention a layer of adhesion is always part of the invention, and a glass panel is always part of the invention.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of reducing electromagnetic losses, incurred by operational semiconductor devices or by thereto attached passive electrical components, said losses incurred in silicon that is in close physical proximity to said operational semiconductor devices or to said thereto attached passive electrical components, comprising:

providing a semiconductor substrate, having a passive surface exposing unprocessed silicon in or on which no semiconductor devices have been created, further having an active surface exposing processed silicon in or on the surface of which semiconductor devices have been created, having points of electrical contact provided to said semiconductor devices in or on the active surface of said substrate;

creating one or more layers of interconnects over the active surface of said substrate, said layers of interconnects comprising conductive interconnect lines or conductive contact points or conductive vias in one or more layers, with points of electrical contact having been provided in or on the surface of said overlaying interconnecting metalization structure, at least one of said points of electrical contact making contact with at least one of said conductive interconnect lines or said conductive contact points or said conductive vias provided in said one or more layers of said overlaying interconnecting metalization structure, at least one of said metal lines or said contact points or said conductive vias making contact with at least one of said points of electrical contact provided to said semiconductor devices in or on the active surface of said substrate;

depositing a layer of passivation over the surface of said one or more layers of interconnects;

providing passive components on the surface of said passivation layer, creating a completed semiconductor device, said completed semiconductor device comprising at least one active semiconductor device created in or on the active surface of said substrate in addition having at least one electrical components overlying said at least one active semiconductor device, said completed semiconductor device being bounded by a first plane that is parallel with and located below the passive surface of said substrate, said first plane forming an interface between said unprocessed silicon of said substrate and said processed silicon of said substrate, further being bounded by a second plane that is parallel with said first plane and coincides with the surface of said passive components, further being bounded by a set of four planes that are perpendicular to the surface of said substrate;

coating the second surface of said completed semiconductor device with a layer of adhesive material, having a surface;

attaching said completed semiconductor device to a glass panel by pressing said surface of said adhesive layer against said glass panel;

removing said unprocessed silicon, starting at the passive surface of said substrate, to about said first plane of said completed semiconductor device; and removing said unprocessed silicon from in between adjacent completed semiconductor devices, using methods of etching, said removal being bounded by said set of four planes bounding said completed semiconductor device.

2. The method of claim 1 with the additional step of providing at least one first access to said one or more layers of interconnects over the active surface of said substrate, said first access being in the surface of said one or more layers of interconnects over the active surface of said substrate that is located closest to the surface of said substrate.

3. The method of claim 1 with the additional step of providing at least one second access to said one or more layers of interconnects over the active surface of said substrate, said second access being in the surface of said one or more layers of interconnects over the active surface of said substrate that is located furthest removed from the surface of said substrate.

4. The method of claim 1 with the additional step of providing a thick layer of insulation, passivating material over the surface of said layer of passivation.

5. The method of claim 4 wherein said insulating, separating layer comprises a polymer dielectric layer or any other appropriate insulating material but more preferably comprises polyimide or the polymer benzocyclobutene (BCB).

6. The method of claim 4 wherein said insulating, separating layer is of a thickness after curing within the range of approximately 1.0 to 150 um.

7. The method of claim 4 wherein said insulating, separating layer is spin-on coated and cured.

8. The method of claim 7 wherein said insulating, separating layer after said spin-on coating is cured at a temperature within the range of approximately 200 to 450 degrees C. for a time within the range of approximately 0.1 to 1.5 hours said curing to occur within a vacuum or nitrogen ambient.

9. The method of claim 4 wherein said insulating, separating layer is subjected to multiple processing steps of spin on coating and curing.

10. The method of claim 9 wherein said insulating, separating layer after each process step of said spin on coating is cured at a temperature within the range of approximately 200 to 450 degrees C. for a time within the range of approximately 0.5 to 1.5 hours said curing the occur within a vacuum or nitrogen ambient.

11. A method of reducing electromagnetic losses incurred by operational semiconductor devices or by thereto attached electrical components, said losses incurred in silicon that is in close physical proximity to said operational semiconductor devices or to said thereto attached electrical components, comprising:

providing a semiconductor substrate, having a passive surface exposing unprocessed silicon in or on which no semiconductor devices have been created, further having an active surface exposing processed silicon in or on the surface of which semiconductor devices have been created, having points of electrical contact provided to said semiconductor devices in or on the active surface of said substrate;

depositing a layer of passivation over the surface of said semiconductor devices created in or on the active surface of said substrate;

providing components on the surface of said layer of passivation, creating a completed semiconductor device, said completed semiconductor device comprising at least one active semiconductor device created in or on the active surface of said substrate, in addition having at least one electrical component overlying said at least one active semiconductor device, said completed semiconductor device being bounded by a first plane that is parallel with and located below the passive surface of said substrate that forms an interface between said unprocessed silicon of said substrate and said processed silicon of said substrate, further being bounded by a second plane that is parallel with said first plane and coincides with the surface of said electrical components, further being bounded by a set of four planes that are perpendicular to the surface of said substrate;

coating the surface of said electrical components with a layer of adhesive material, having a surface;

attaching said completed semiconductor device to a glass panel by pressing said surface of said adhesive layer against said glass panel;

removing said unprocessed silicon, starting at the passive surface of said substrate, to about said first plane of said completed semiconductor device, using methods of backside grinding or Chemical Mechanical Polishing (CMP); and removing said unprocessed silicon from in between adjacent completed semiconductor devices, using methods of etching, said removal being bounded by said set of four planes bounding said completed semiconductor device.

12. The method of claim 11 with the additional step of providing at least one access to said points of electrical contact provided to said semiconductor devices in or on the active surface of said substrate.

13. The method of claim 11 with the additional step of providing a thick layer of insulation, passivating material over the surface of said layer of passivation.

14. The method of claim 13 wherein said insulating, separating layer comprises a polymer dielectric layer or any other appropriate insulating material but more preferably comprises polyimide or the polymer benzocyclobutene (BCB).

15. The method of claim 13 wherein said insulating, separating layer is of a thickness after curing within the range of approximately 1.0 to 30 um.

16. The method of claim 13 wherein said insulating, separating layer is spin-on coated and cured.

17. The method of claim 13 wherein said insulating, separating layer is subjected to multiple processing steps of spin on coating and curing.

18. A structure for reducing electromagnetic losses, incurred by operational semiconductor devices or by thereto attached passive electrical components, said losses incurred in silicon that is in close physical proximity to said operational semiconductor devices or to said thereto attached passive electrical components, comprising:

a semiconductor substrate, having a passive surface exposing unprocessed silicon in or on which no semiconductor devices have been created, further having an active surface exposing processed silicon in or on the surface of which semiconductor devices have been created, having points of electrical contact provided to staid semiconductor devices in or on the active surface of said substrate;

one or more layers of interconnects over the active surface of said substrate, said layers of interconnects comprising conductive interconnect lines or conductive contact points or conductive vias in one or more layers, with points of electrical contact having been provided in or on the surface of said overlaying interconnecting metalization structure, at least one of said points of electrical contact making contact with at least one of said conductive interconnect lines or said conductive contact points or said conductive vias provided in said one or more layers of said overlaying interconnecting metalization structure, at least one of said metal lines or said contact points or said conductive vias making contact with at least one of said points of electrical contact provided to said semiconductor devices in or on the active surface of said substrate;

a layer of passivation deposited over the surface of said one or more layers of interconnects;

passive components created on the surface of said passivation layer, creating a completed semiconductor device, said completed semiconductor device comprising at least one active semiconductor device created in or on the active surface of said substrate in addition having at least one electrical component overlying said at least one active semiconductor device, said completed semiconductor device being bounded by a first plane that is parallel with and located below the passive surface of said substrate, said first plane forming an interface between said unprocessed silicon of said substrate and said processed silicon of said substrate, further being bounded by a second plane that is parallel with said first plane and coincides with the surface of said passive components, further being bounded by a set of four planes that are perpendicular to the surface of said substrate;

a layer of adhesive material, having a surface, coated over the second surface of said completed semiconductor device;

said completed semiconductor device attached to a glass panel by pressing said surface of said adhesive layer against said glass panel;

said unprocessed silicon having been removed, starting at the passive surface of said substrate, to about said first plane of said completed semiconductor device, using methods of backside grinding or Chemical Mechanical Polishing (CMP); and said unprocessed silicon having been removed from in between adjacent completed semiconductor devices, using methods of etching, said removal being bounded by said set of four planes bounding said completed semiconductor device.

19. The structure of claim 18 with the addition of at least one first access to said one or more layers of interconnects over the active surface of said substrate, said first access being in the surface of said one or more layers of interconnects over the active surface of said substrate that is located closest to the surface of said substrate.

20. The structure of claim 18 with the addition of at least one second access to said one or more layers of interconnects over the active surface of said substrate, said second access being in the surface of said one or more layers of interconnects over the active surface of said substrate that is located furthest removed from the surface of said substrate.

21. The structure of claim 18 with the addition of a thick layer of insulation, passivating material over the surface of said layer of passivation.

22. The structure of claim 21 wherein said insulating, separating layer comprises a polymer dielectric layer or any other appropriate insulating material but more preferably comprises polyimide or the polymer benzocyclobutene (BCB).

23. The structure of claim 21 wherein said insulating, separating layer is of a thickness after curing within the range of approximately 1.0 to 150 um.

24. The structure of claim 21 wherein said insulating, separating layer is spin-on coated and cured.

25. The structure of claim 24 wherein said insulating, separating layer after said spin-on coating is cured at a temperature within the range of approximately 250 to 450 degrees C. for a time within the range of approximately 0.5 to 1.5 hours said curing to occur within a vacuum or nitrogen ambient.

26. The structure of claim 21 wherein said insulating, separating layer is subjected to multiple processing steps of spin on coating and curing.

27. The structure of claim 26 wherein said insulating, separating layer after each process step of said spin on coating is cured at a temperature within the range of approximately 200 to 450 degrees C. for a time within the range of approximately 0.1 to 1.5 hours said curing the occur within a vacuum or nitrogen ambient.

28. A structure for reducing electromagnetic losses incurred by operational semiconductor devices or by thereto attached electrical components, said losses incurred in silicon that is in close physical proximity to said operational semiconductor devices or to said thereto attached electrical components, comprising:

a semiconductor substrate, having a passive surface exposing unprocessed silicon in or on which no semiconductor devices have been created, further having an active surface exposing processed silicon in or on the surface of which semiconductor devices have been created, having points of electrical contact provided to said semiconductor devices in or on the active surface of said substrate;

a layer of passivation deposited over the surface of said semiconductor devices created in or on the active surface of said substrate;

components provided on the surface of said layer of passivation, creating a completed semiconductor device, said completed semiconductor device comprising at least one active semiconductor device created in or on the active surface of said substrate, in addition having at least one passive electrical components overlying said at least one active semiconductor device, said completed semiconductor device being bounded by a first plane that is parallel with and located below the passive surface of said substrate that forms an interface between said unprocessed silicon of said substrate and said processed silicon of said substrate, further being bounded by a second plane that is parallel with said first plane and coincides with the surface of said passive components, further being bounded by a set of four planes that are perpendicular to the surface of said substrate;

a layer of adhesive material, having a surface, coated over the surface of said components with;

said completed semiconductor device attached to a glass panel by pressing said surface of said adhesive layer against said glass panel;

said unprocessed silicon having been removed, starting at the passive surface of said substrate, to about said first plane of said completed semiconductor device, using methods of backside grinding or Chemical Mechanical Polishing (CMP); and said unprocessed silicon having been removed from in between adjacent completed semiconductor devices, using methods of etching, said removal being bounded by said set of four planes bounding said completed semiconductor device.

29. The structure of claim 28 with the of at least one access to said points of electrical contact provided to said semiconductor devices in or on the active surface of said substrate.

30. The structure of claim 28 with the addition a thick layer of insulation, passivating material over the surface of said layer of passivation.

31. The structure of claim 30 wherein said insulating, separating layer comprises a polymer dielectric layer or any other appropriate insulating material but more preferably comprises polyimide or the polymer benzocyclobutene (BCB).

32. The structure of claim 30 wherein said insulating, separating layer is of a thickness after curing within the range of approximately 1.0 to 150 um.

33. The structure of claim 30 wherein said insulating, separating layer is spin-on coated and cured.

34. The structure of claim 30 wherein said insulating, separating layer is subjected to multiple processing steps of spin on coating and curing.

35. The method of claim 1 wherein said removing said unprocessed silicon, starting at the passive surface of said substrate, uses methods of backside grinding or Chemical Mechanical Polishing (CMP).

36. The method of claim 18 wherein said removing said unprocessed silicon, starting at the passive surface of said substrate, uses methods of backside grinding or Chemical Mechanical Polishing (CMP).

37. The method of claim 1 wherein said passive electrical components are selected from a group comprising thin film passive components and discrete passive components.

38. The method of claim 11 wherein said at least one electrical component is selected from a group comprising at least one thin film passive component and at least one discrete passive component.

39. The method of claim 18 wherein said passive components are selected from a group comprising thin film passive components and discrete passive components.

40. The method of claim 28 wherein said passive electrical components are selected from a group comprising thin film passive components and discrete passive components.

* * * * *